(12) United States Patent
Onishi et al.

(10) Patent No.: US 8,288,838 B2
(45) Date of Patent: Oct. 16, 2012

(54) SEMICONDUCTOR UNIT

(75) Inventors: Hiroyuki Onishi, Aichi-ken (JP); Toshiaki Nagase, Aichi-ken (JP); Jun Ishikawa, Aichi-ken (JP); Kazuyoshi Kontani, Aichi-ken (JP); Toshiaki Fukatsu, Aichi-ken (JP)

(73) Assignee: Kabushiki Kaisha Toyota Jidoshokki (JP)

(*) Notice: Subject to any disclaimer, the term of this patent is extended or adjusted under 35 U.S.C. 154(b) by 262 days.

(21) Appl. No.: 12/464,985

(22) Filed: May 13, 2009

(65) Prior Publication Data

US 2009/0283765 A1 Nov. 19, 2009

(30) Foreign Application Priority Data

May 13, 2008 (JP) ................................. 2008-126108

(51) Int. Cl.
*H01L 31/058* (2006.01)
(52) U.S. Cl. ...................... 257/467; 257/48; 257/E23.08
(58) Field of Classification Search ................... 257/48, 257/467
See application file for complete search history.

(56) References Cited

U.S. PATENT DOCUMENTS

| | | | | |
|---|---|---|---|---|
| 5,281,803 A | * | 1/1994 | Ishizuka | 250/208.1 |
| 5,911,897 A | | 6/1999 | Hamilton | |
| 6,142,356 A | * | 11/2000 | Yamazaki et al. | 228/6.2 |
| 6,477,047 B1 | | 11/2002 | Markwardt et al. | |
| 6,962,437 B1 | * | 11/2005 | Rajagopalan et al. | 374/179 |
| 7,812,705 B1 | * | 10/2010 | Kozhukh et al. | 338/220 |
| 2001/0011900 A1 | * | 8/2001 | Hembree | 324/755 |
| 2002/0075024 A1 | * | 6/2002 | Fredeman et al. | 324/760 |
| 2005/0068053 A1 | * | 3/2005 | Conti et al. | 324/754 |
| 2009/0251875 A1 | * | 10/2009 | Nagashima et al. | 361/781 |

FOREIGN PATENT DOCUMENTS

| | | |
|---|---|---|
| DE | 19630902 A1 | 2/1998 |
| JP | 2001-060659 | 3/2001 |
| JP | 2002-76236 | 3/2002 |
| WO | WO 2006/011712 A1 | 2/2006 |

OTHER PUBLICATIONS

"Chip Temperature Monitoring Device", IBM Technical Disclosure Bulletin, International Business Machines Corp. (Thornwood), US, Sep. 1, 1990, 33(4), 442-443.

* cited by examiner

*Primary Examiner* — A. Sefer

(74) *Attorney, Agent, or Firm* — Woodcock Washburn LLP

(57) ABSTRACT

A semiconductor unit includes a semiconductor chip, a ceramic substrate having a circuit pattern on which the semiconductor chip is mounted, and a temperature sensor for detecting a temperature. The semiconductor unit further includes a pressing member for retaining the temperature sensor by pressing against the ceramic substrate.

5 Claims, 5 Drawing Sheets

SEMICONDUCTOR UNIT

CROSS REFERENCE TO RELATED APPLICATION

This application claims priority to Japanese Application No. 2008-126108 filed May 13, 2008.

BACKGROUND

The present invention relates to a semiconductor unit that includes a means for detecting a temperature of a semiconductor chip mounted on a circuit pattern of a ceramic substrate.

In semiconductor units, a temperature of the semiconductor unit is detected by a temperature detector to prevent damage on a semiconductor chip due to an excessive temperature rise caused by driving the semiconductor chip. In a semiconductor unit disclosed, for example, in Japanese Unexamined Patent Application Publication No. 2002-76236, when such temperature rise is detected, the drive of the semiconductor chip is shut down. In the semiconductor unit disclosed in the reference No. 2002-76236, as shown in FIG. 7, semiconductor chips 53 are mounted on one of circuit patterns 52 formed on a ceramic substrate 51. One of the terminals of a thermistor 54 is soldered to the circuit pattern 52 on which the semiconductor chips 53 are mounted. The other terminal of the thermistor 54 is soldered to the different circuit pattern 52.

In a semiconductor chip incorporating a temperature sensor, a temperature of the semiconductor chip can be directly detected. In addition, as shown in FIG. 8, a temperature of semiconductor chips 63 mounted on a ceramic substrate 61 can be detected also by an external thermistor 66. The thermistor 66 is mounted on a metal base 65 by a screw 67. The ceramic substrate 61 has a circuit pattern 62 formed on the upper surface of a ceramic plate 69. Each of the semiconductor chips 63 is mounted on the circuit pattern 62 by solder H. The ceramic substrate 61 has a metal plate 68 bonded to the lower surface of the ceramic plate 69 and mounted on the metal base 65 by solder H.

In the semiconductor unit as shown in FIG. 7, when the thermistor 54 is mounted on the ceramic substrate 51 by soldering, the thermistor 54 need to be located across the different circuit patterns 52, and the process of manufacturing the semiconductor unit becomes complicated, accordingly. In addition, since one of the terminals of the thermistor 54 is soldered to the circuit pattern 52 on which the semiconductor chip 53 is mounted, the thermistor 54 is affected by noise generated by the switching operation of the semiconductor chips 53.

Also when the temperature sensor is incorporated in the semiconductor chip, the temperature sensor is affected by noise generated due to the switching operation of the semiconductor chip. Therefore, though the temperature sensor is located close to the semiconductor chip, a temperature of the semiconductor chip cannot be detected accurately. Additionally, in semiconductor units having a plurality of identical semiconductor chips, a temperature is generally detected at not all the semiconductor chips, but only at one semiconductor chip and, therefore, a space for connecting the temperature sensor in the other semiconductor chips of which temperature are not detected becomes useless. Furthermore, in the case of parallel-connected semiconductor chips used in an inverter so that a large amount of current flows through each arm, temperatures of all the semiconductor chips in each arm need not to be detected. However, the size of the semiconductor chip incorporating the temperature sensor is large, resulting in enlargement of the entire size of the semiconductor unit.

In the semiconductor unit as shown in FIG. 8, when the thermistor 66 is mounted to the metal base 65 by the screw 67, heat generated in the semiconductor chip 63 is transferred through the solder H, the circuit pattern 62, the ceramic plate 69, the metal plate 68, the solder H and the metal base 65 to the thermistor 66. In such a case, since heat transfer resistance of a path from the semiconductor chip 63 to the thermistor 66 is large, the time when the thermistor 66 detects actual temperature of the semiconductor chip 63 may be delayed, or the thermistor 66 may fail to detect peak temperature of the semiconductor chip 63.

The present invention is directed to providing a semiconductor unit that allows more accurate detection of a temperature of a semiconductor chip mounted on a circuit pattern of a ceramic substrate without enlarging the size of the unit.

SUMMARY

In accordance with an aspect of the present invention, a semiconductor unit includes a semiconductor chip, a ceramic substrate having a circuit pattern on which the semiconductor chip is mounted, and a temperature sensor for detecting a temperature. The semiconductor unit further includes a pressing member for retaining the temperature sensor by pressing against the ceramic substrate.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF ILLUSTRATIVE EMBODIMENTS

The following will describe a three-phase inverter 11 according to the first embodiment of the present invention with reference to FIGS. 1 through 4.

Figure 1A:
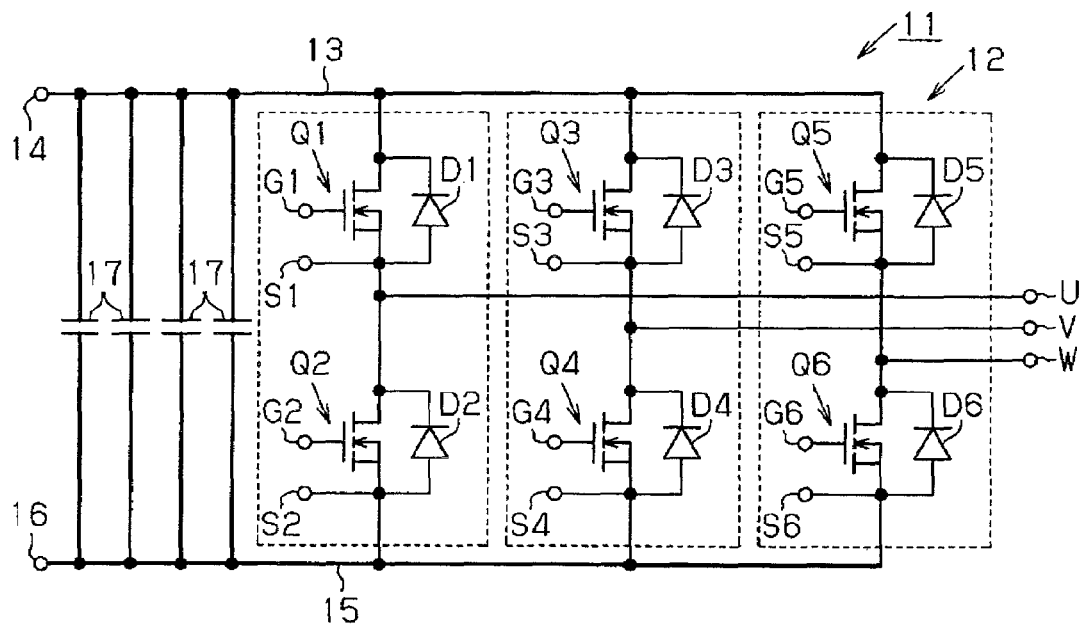
FIG. 1A is a circuit diagram of an inverter.

Referring to FIG. 1A, the inverter 11 (semiconductor unit) has an inverter circuit 12 including six switching devices Q1, Q2, Q3, Q4, Q5 and Q6. MOSFET (metal-oxide-semiconductor field-effect transistor) is used for the switching devices Q1 through Q6. The serially connected pairs of switching devices Q1 and Q2, Q3 and Q4, and Q5 and Q6 are connected in parallel. Diodes D1, D2, D3, D4, D5 and D6 are inversely connected in parallel to the switching devices Q1, Q2, Q3, Q4, Q5 and Q6, respectively. Each of pairs of the switching device and the diode Q1 and D1, Q3 and D3, and Q5 and D5 is referred to as an upper arm. Each of pairs of the switching device and the diode Q2 and D2, Q4 and D4, and Q6 and D6 is referred to as a lower arm.

Each of the switching devices Q1, Q3 and Q5 has a drain terminal connected to a positive input terminal 14 via a line 13, and each of the switching devices Q2, Q4 and Q6 has a source terminal connected to a negative input terminal 16 via a line 15. Plural capacitors 17 are connected in parallel between the lines 13 and 15. In the present embodiment, an electrolytic capacitor is used for the capacitors 17. Each capacitor 17 has a positive terminal connected to the line 13 and a negative terminal connected to the line 15.

Figure 1B:
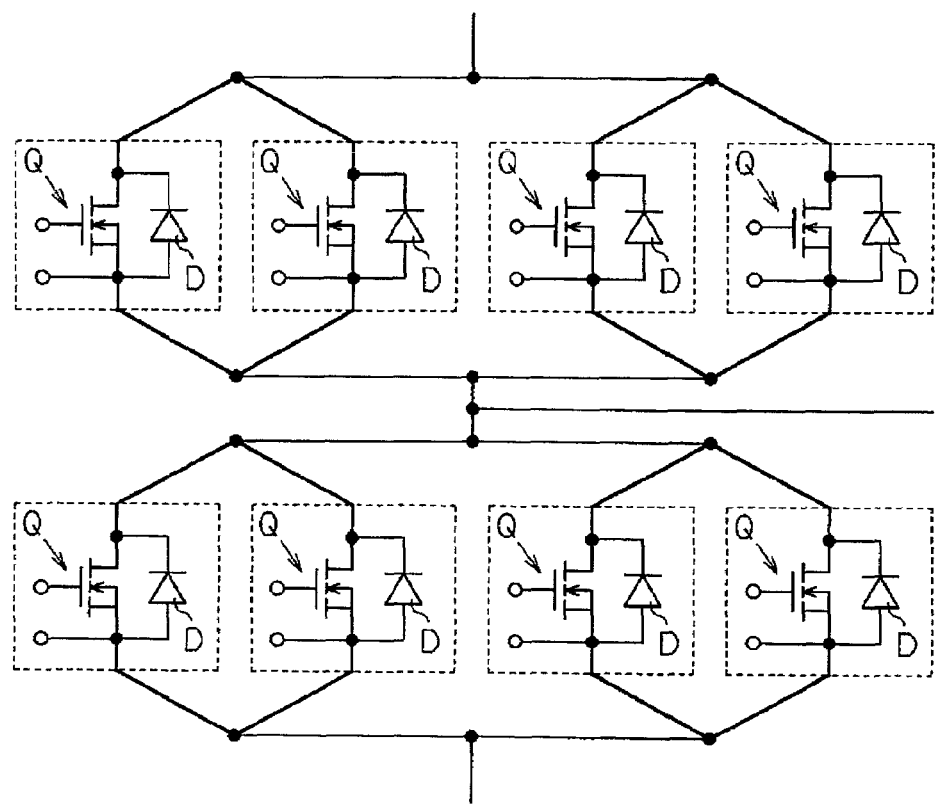
FIG. 1B is an example of a circuit diagram of each arm.

A node between the switching devices Q1 and Q2 is connected to a U-phase terminal U, a node between the switching devices Q3 and Q4 is connected to a V-phase terminal V, and a node between the switching devices Q5 and Q6 is connected to a W-phase terminal W. Each of the switching devices Q1, Q2, Q3, Q4, Q5 and Q6 has a gate terminal connected to signal terminals G1, G2, G3, G4, G5 and G6, and has a source terminal connected to signal terminals S1, S2, S3, S4, S5 and S6, respectively. In FIG. 1A, each of the upper and lower arms is composed of one switching device and one diode, but each arm may be composed of plural pairs of a switching device Q and a diode D connected in parallel, as shown in FIG. 1B. In the present embodiment, each arm is composed of four pairs of the switching device Q and the diode D.

Figure 2:
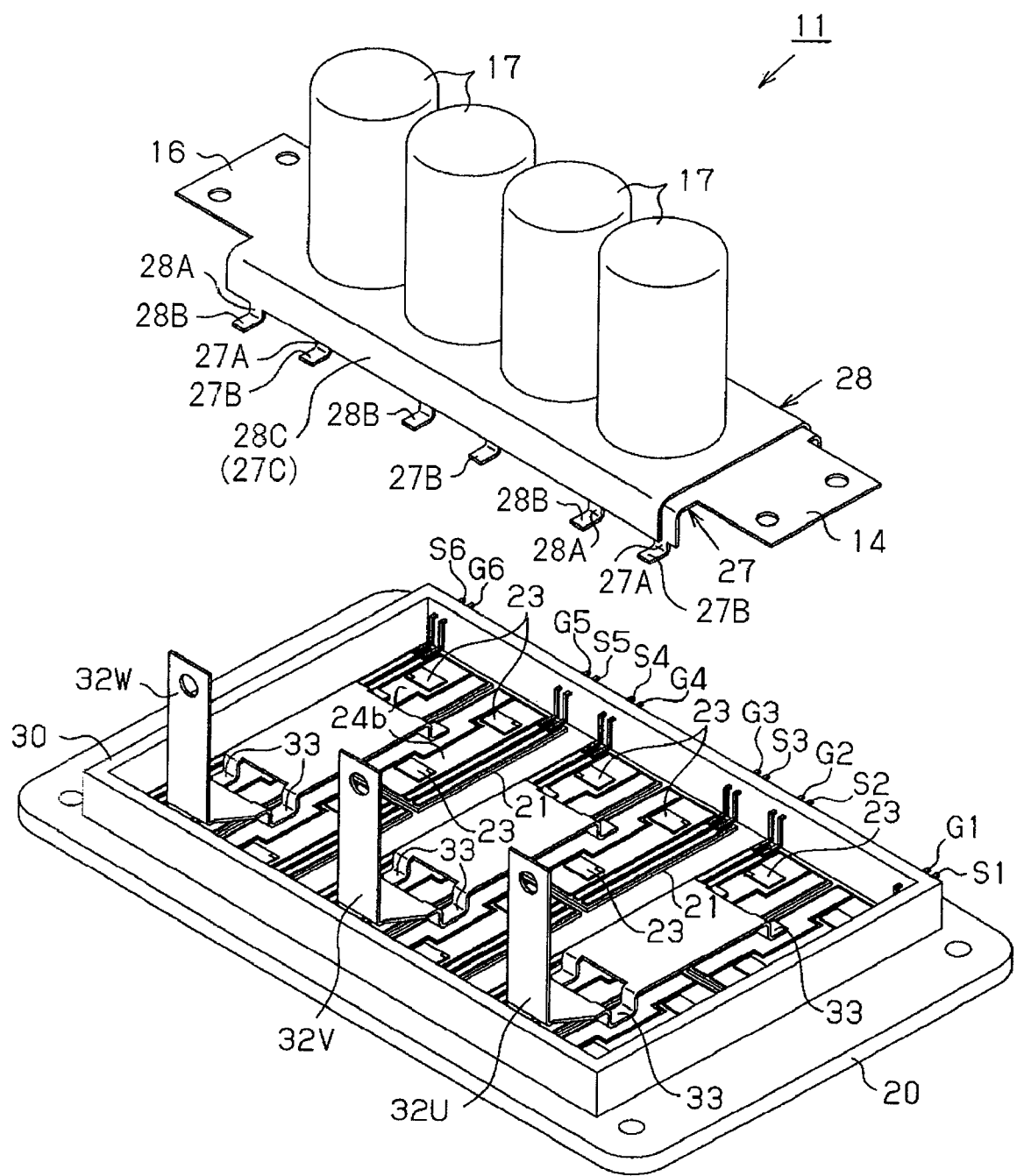
FIG. 2 is an exploded perspective view of the inverter.

The following will describe the structure of the inverter 11. Referring to FIG. 2, the inverter 11 includes a metal base 20, ceramic substrates 21 and semiconductor chips 23. The metal base 20 is made of copper alloy and cooperates with the ceramic substrates 21 to form a base plate. The semiconductor chips 23 are mounted on the ceramic substrates 21. Each semiconductor chip 23 has one switching device (MOSFET) and one diode in combination as a one-chip device. That is, each semiconductor chip 23 has one switching device Q and one diode D of FIG. 1B.

Figure 3:
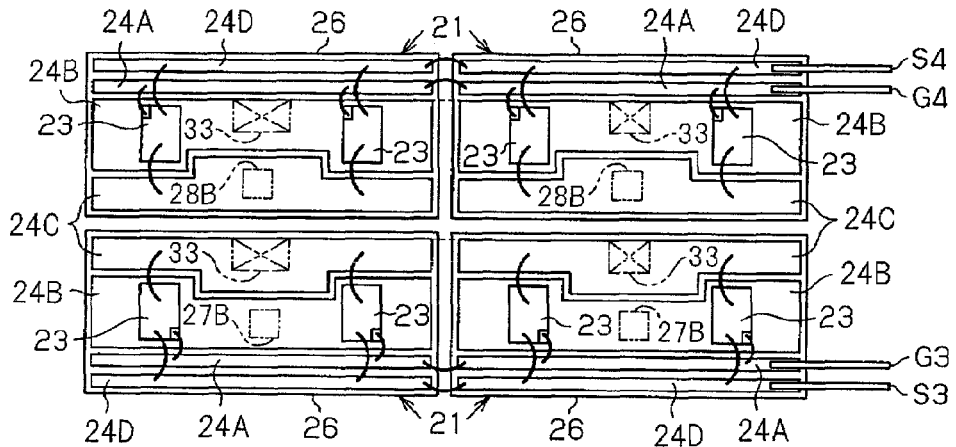
FIG. 3 is a schematic view showing positional relationship of semiconductor chips, ceramic substrates and circuit patterns.

Referring to FIG. 3, each ceramic substrate 21 has circuit patterns 24A, 24B, 24C and 24D formed on the upper surface of a ceramic plate 26. The ceramic substrate 21 has a metal plate (not shown) on the lower surface of the ceramic plate 26, so as to bond to the metal base 20. The ceramic plate 26 is made of, for example, aluminum nitride, alumina or silicon nitride. The circuit patterns 24A, 24B, 24C and 24D and the metal plate are made of, for example, aluminum or copper. The ceramic substrate 21 is soldered to the metal base 20 with the metal plate. Hereinafter, the metal base 20 is described as the bottom of the inverter 11.

Referring to FIG. 2, each of the metal base 20 and the ceramic substrates 21 has a generally rectangular shape. A total of twelve ceramic substrates 21 are arranged in six rows and two columns on the metal base 20 so that longitudinal directions of the ceramic substrate 21 and the longitudinal direction of the metal base 20 are perpendicular to each other. Each of the upper and lower arms of the inverter circuit 12 (see FIG. 1A) is composed of the semiconductor chips 23 mounted on two ceramic substrates 21 arranged in each row, and three pairs of the upper and lower arms are arranged on the metal base 20. In the present embodiment, as shown in FIG. 3, each ceramic substrate 21 has two semiconductor chips 23 and, therefore, each arm is composed of four semiconductor chips 23. It is noted that FIG. 3 shows the second pair of the upper and lower arms.

Referring to FIG. 3, the circuit pattern 24A is for conducting a gate signal, the circuit pattern 24B is for conducting a drain current, the circuit pattern 24C is for conducting a source current, and the circuit pattern 24D is for conducting a source signal. The semiconductor chip 23 is mounted on the circuit pattern 24B by soldering. The gate of the semiconductor chip 23 is electrically connected to the circuit pattern 24A by wire bonding, and the source of the semiconductor chip 23 is electrically connected to the circuit patterns 24C and 24D by wire bonding.

Referring to FIG. 2, the inverter 11 includes a positive conductor 27 and a negative conductor 28. The positive and negative conductors 27 and 28 are made of a conductive plate and arranged above the metal base 20. The positive and negative conductors 27 and 28 are disposed adjacent and parallel to each other and respectively extend parallel to the metal base 20. The positive and negative conductors 27 and 28 are insulated from each other through an insulator (not shown) interposed therebetween. In the present embodiment, the negative conductor 28 is placed over the positive conductor 27, and four capacitors 17 are arranged on the negative conductor 28 with the positive and negative terminals thereof facing downward. The positive and negative conductors 27 and 28 serve as the lines 13 and 15 of FIG. 1A, respectively.

The positive conductor 27 includes three pairs of terminal portions 27A that extend from both end sides of the positive conductor 27 toward the ceramic substrates 21. The terminal portion 27A is then bent so as to extend parallel to the upper surface of the positive conductor 27 to form a terminal end 27B that is joined to the circuit pattern 24B. As with the positive conductor 27, the negative conductor 28 also includes similar terminal portions 28A respectively having a terminal end 28B that is joined to the circuit pattern 24C. The positive and negative conductors 27 and 28 further include side portions 27C and 28C from which the terminal portions 27A and 28A extend downward, respectively. The side portions 27C and 28C are disposed adjacent to each other.

The inverter 11 includes a frame 30 made of a non-conductive material. The frame 30 is of a rectangular shape and mounted around the ceramic substrates 21 on the metal base 20. A positive input terminal 14 is formed at a longitudinal end of the positive conductor 27 so as to extend outward of the frame 30. A negative input terminal 16 is formed at a longitudinal end of the negative conductor 28 opposite from the positive input terminal 14 so as to extend outward of the frame 30.

The inverter 11 includes three output electrodes 32U, 32V and 32W having a generally L shape as viewed in the longitudinal direction of the metal base 20. Horizontal portions of the output electrodes 32U, 32V and 32W extend below the positive conductor 27 in a direction that is perpendicular to longitudinal direction of the positive conductor 27. Vertical portions of the output electrodes 32U, 32V and 32W extend upward at a position near the wall of the frame 30. The horizontal portion is formed with four connecting portions 33 that are joined to the circuit patterns 24B and 24C. Two of the four connecting portions 33 are located at the end of the horizontal portion away from the vertical portion, and the rest of the four connecting portions 33 are located at a position near the vertical portion. The electrodes 32U, 32V and 32W are insulated from the positive conductor 27 through silicone gel (not shown). The output electrode 32U is mounted by ultrasonic bonding on the circuit patterns 24C of the upper arm composed of the switching device Q1 and the diode D1, and on the circuit patterns 24B of the lower arm composed of the switching device Q2 and the diode D2. The output electrode 32V is mounted by ultrasonic bonding on the circuit patterns 24C of the upper arm composed of the switching device Q3 and the diode D3, and on the circuit patterns 24B of the lower arm composed of the switching device Q4 and the diode D4. The output electrode 32W is mounted by ultrasonic bonding on the circuit patterns 24C of the upper arm composed of the switching device Q5 and the diode D5, and on the circuit patterns 24B of the lower arm composed of the switching device Q6 and the diode D6.

Referring to FIGS. 2 and 3, signal terminals G1, G2, G3, G4, G5 and G6 are connected to the circuit patterns 24A of the ceramic substrates 21 that are located away from the vertical portions of the output electrodes 32U, 32V and 32W. Signal terminals S1, S2, S3, S4, S5 and S6 are connected to the circuit patterns 24D of the ceramic substrates 21 that are located away from the vertical portions of the output electrodes 32U, 32V and 32W. The signal terminals G1 through G6 and S1 through S6 are molded integrally with the frame 30, and projecting outward of the frame 30. Two adjacent circuit patterns 24A of the ceramic substrates 21 of each arm are connected to each other by wire bonding, and two adjacent circuit patterns 24D of the ceramic substrates 21 of each arm are connected to each other by wire bonding.

Figure 4A:
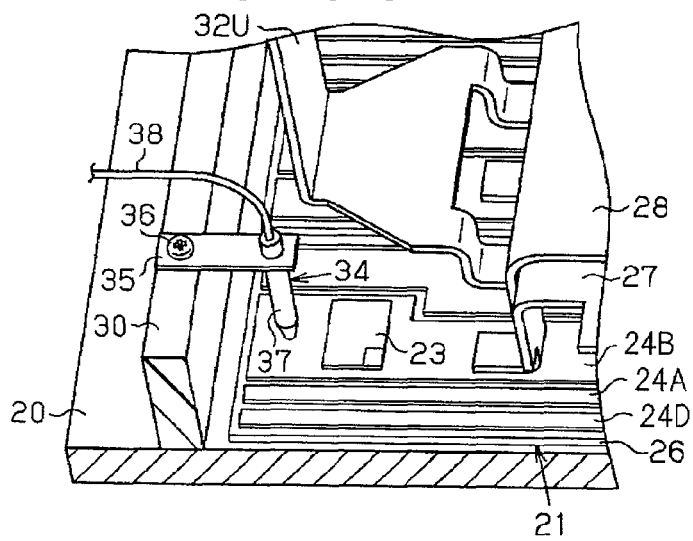
FIG. 4A is a perspective view of a temperature sensor and a pressing member according to a first embodiment of the present invention.
Figure 4B:
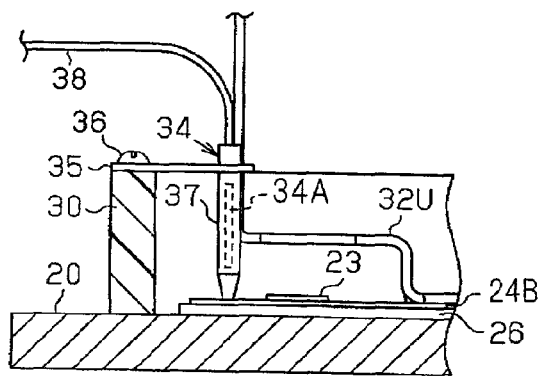
FIG. 4B is a side view of the temperature sensor and the pressing member.

Referring to FIGS. 4A and 4B, the inverter 11 includes a temperature sensor 34 to detect a temperature of the semiconductor chip 23 mounted on the circuit pattern 24B. The temperature sensor 34 is mounted by press fitting to a projecting end of a support plate 35 that is fixed to the frame 30 by a screw 36 and projected over the ceramic substrate 21 from the frame 30. In the present embodiment, a leaf spring is used for the support plate 35. The temperature sensor 34 is composed of a cylindrical case 37, a signal wire 38 and a thermistor 34A. The cylindrical case 37 is made of a metal having a high thermal conductivity such as copper, aluminum or stainless steel. The signal wire 38 extends out of the cylindrical case 37. The thermistor 34A is received in the cylindrical case 37 and sealed by an electrically insulating material having a high thermal conductivity. The temperature sensor 34 detects a temperature of the semiconductor chip 23 with the end of the cylindrical case 37 pressed to the ceramic substrate 21.

The support plate 35 functions as a pressing member that keeps the temperature sensor 34 pressed to the ceramic substrate 21. In the present embodiment, the temperature sensor 34 is pressed to the circuit pattern 24B on which the semiconductor chips 23 are mounted. If a pressing force that the ceramic substrate 21 receives from the temperature sensor 34 is too large, the ceramic substrate 21 may be damaged. Therefore, it is preferable that a pressing force that the support plate 35 provides to the ceramic substrate 21 is as large as, for example, 50 N or less so as to prevent the damage on the ceramic substrate 21. Specifically, it is preferable that the pressing force is, for example, in the range of 10 to 30 N so as to provide an adequate pressing force to the ceramic substrate 21.

The following will describe the operation of the inverter 11. The inverter 11 is used as, for example, a part of a vehicle power supply. Referring to FIG. 1A, the positive and negative input terminals 14 and 16 are connected to a DC power supply (not shown), the U-phase terminal U, the V-phase terminal V and the W-phase terminal W are connected to a motor (not shown), and the signal terminals G1 through G6 and S1 through S6 are connected to a controller (not shown). The signal wire 38 of the temperature sensor 34 is connected to the controller.

When the switching devices Q1, Q3 and Q5 of the upper arms and the switching devices Q2, Q4 and Q6 of the lower arms are turned on or off in a given cycle, AC power is supplied to the motor, and the motor is driven, accordingly.

Such switching operation of the switching devices Q1 through Q6 generates a rapid rise or fall of currents flowing through the positive and negative conductors 27 and 28 in opposite directions. Since the positive and negative conductors 27 and 28 both have a plate shape and disposed parallel to and adjacent to each other, the line inductance is lowered because of the mutual inductance. In addition, the side portions 27C and 28C of the positive and negative conductors 27 and 28 are also disposed parallel to and adjacent to each other, and the line inductance is therefore reduced, as compared to a case wherein such parallel side portions are not provided.

The controller controls the operation of the switching devices Q1 through Q6, that is, the operation of the semiconductor chips 23 so that power is supplied to the load as required. The switching operation of the semiconductor chip 23 causes generation of heat in the semiconductor chip 23. The heat is transferred to the metal base 20 and then radiated into the atmosphere. However, when the heat is not radiated sufficiently due to a large amount of heat generated in the semiconductor chips 23, a temperature of the semiconductor chip 23 may increase above the upper temperature limit. When the semiconductor chip 23 continues to operate at such high temperature, the semiconductor chip 23 may be damaged.

To prevent the damage on the semiconductor chip 23, the temperature sensor 34 detects a temperature that corresponds to a temperature of the semiconductor chip 23, and outputs a detection signal to the controller. Based on the detection signal, the controller controls the switching operation of the semiconductor chip 23 so that a temperature around the semiconductor chip 23 does not exceed the upper temperature limit.

Figure 8:
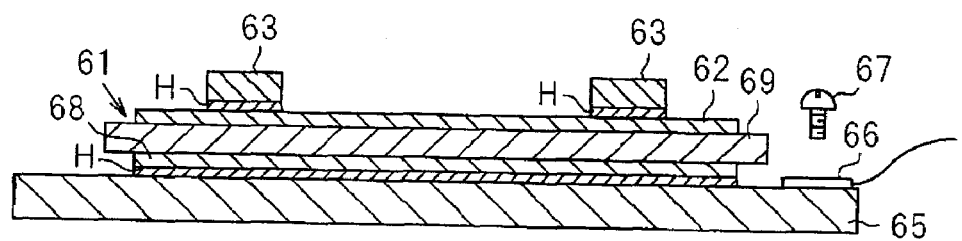
FIG. 8 is a sectional view of another semiconductor unit as a background art.

The temperature sensor 34 detects a temperature in the condition of being pressed to the ceramic substrate 21 that has the circuit pattern 24B on which the semiconductor chips 23 are mounted. The controller receives the detection signal from the temperature sensor 34, and calculates a temperature of the semiconductor chip 23 based on a map or a function previously stored in a memory. Since heat transfer resistance of a path from the semiconductor chip 23 to the temperature sensor 34 is smaller, as compared to the one in the conventional external sensor of FIG. 8, the temperature of the semiconductor chips 23 can be detected more accurately. In addition, since the temperature sensor 34 needs only to be pressed to some part of the ceramic substrate 21, a space for the temperature sensor 34 can be easily provided without enlarging the size of the semiconductor unit. Thus, the size of the semiconductor unit can be reduced, as compared to a size wherein a semiconductor chip incorporating a temperature sensor is used.

The inverter 11 according to the first embodiment has the following advantages.

(1) The semiconductor chip 23 is mounted on the circuit pattern 24B of the ceramic substrate 21. The support plate 35 (pressing member) keeps pressing the temperature sensor 34 to the ceramic substrate 21. Since heat transfer resistance of a path from the semiconductor chip 23 to the temperature sensor 34 is smaller, as compared to the one in the conventional external sensor of FIG. 8, a temperature of the semiconductor chips 23 can be detected more accurately. In addition, since the temperature sensor 34 needs only to be pressed to a part of the ceramic substrate 21, the size of the semiconductor unit can be reduced, as compared to a case wherein a semiconductor chip incorporating a temperature sensor is used.

(2) The temperature sensor 34 is pressed to the circuit pattern 24B on which the semiconductor chip 23 is mounted. Therefore, a temperature of the semiconductor chip 23 can be detected more accurately, as compared to a case wherein the temperature sensor 34 is pressed to the ceramic plate 26 of the substrate 21 or the circuit patterns 24A, 24C and 24D on which the semiconductor chip 23 is not mounted.

(3) Since the pressing member is provided by a leaf spring that also functions as the support plate 35, the structure of the pressing member is simple.

(4) The temperature sensor 34 is composed of the cylindrical case 37 made of a metal having a high thermal conductivity, the signal wire 38 extending out of the cylindrical case 37, and the thermistor 34A received in the cylindrical case 37 and sealed by an electrically insulating material having a high thermal conductivity. Therefore, a temperature of the semiconductor chip 23 can be calculated from the detection signal of the temperature sensor 34, regardless of an electric potential at a point where the temperature sensor 34 is pressed.

Figure 5A:
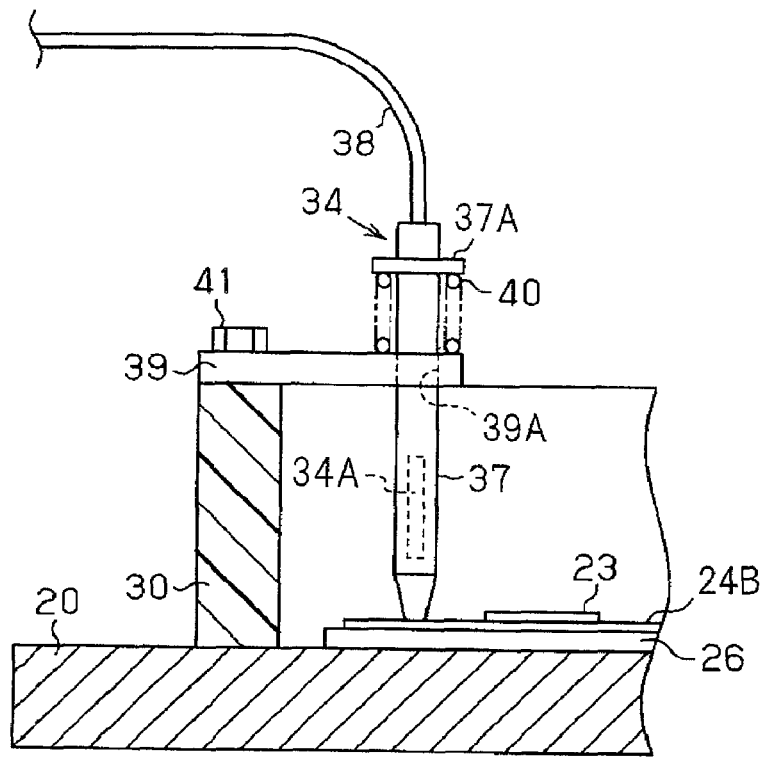
FIG. 5A is a side view of a pressing member according to a second embodiment of the present invention.

FIG. 5A shows a pressing member according to the second embodiment of the present invention. The pressing member of the second embodiment is provided by a coil spring 40. The cylindrical case 37 of the temperature sensor 34 is inserted in a through hole 39A of a rigid support plate 39 that is mounted to the frame 30 by a bolt 41. The coil spring 40 is disposed between the support plate 39 and a flange portion 37A of the cylindrical case 37. The ends of the coil spring 40 are respectively fixed to the support plate 39 and the flange portion 37A. The coil spring 40 urges the cylindrical case 37 toward the ceramic substrate 21. That is, the length from a part where the cylindrical case 37 projects below the support plate 39 to the end before the support plate 39 is mounted to the frame 30 is longer than the length after the support plate 39 is mounted to the frame 30. The end of the cylindrical case 37 of the temperature sensor 34 is kept pressed to the circuit pattern 24B adequately by a spring force of the coil spring 40.

Figure 5B:
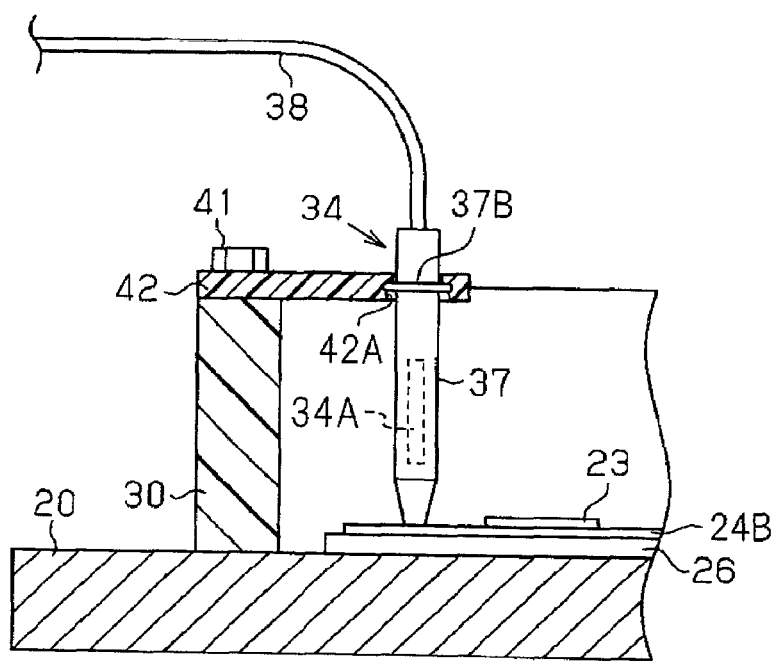
FIG. 5B is a side view of a pressing member according to a third embodiment of the present invention.

FIG. 5B shows a pressing member according to the third embodiment of the present invention. The pressing member of the third embodiment is provided by a support plate 42. The support plate 42 is made of a resin and mounted to the frame 30 by the bolt 41. The support plate 42 is projected over the ceramic substrate 21 from the frame 30. The temperature sensor 34 is mounted to the projecting end of the support plate 42 and pressed to the circuit pattern 24B by bending elasticity of the support plate 42. That is, the support plate 42 is a leaf spring made of a resin. The cylindrical case 37 of the temperature sensor 34 includes a flange portion 37B, the outer peripheral surface of which is rounded. The cylindrical case 37 is inserted in a through hole 42A formed in the support plate 42, and mounted to the support plate 42 via the flange portion 37B. The support plate 42, which is in a curved shape before being mounted to the frame 30, is straightened by screwing the bolt 41 into the frame 30. The support plate 42 is thus mounted to the frame 30 while extending parallel to the metal base 20, thereby keeping the temperature sensor 34 pressed to the circuit pattern 24B.

The above embodiments may be modified in various ways as exemplified below.

Figure 6:
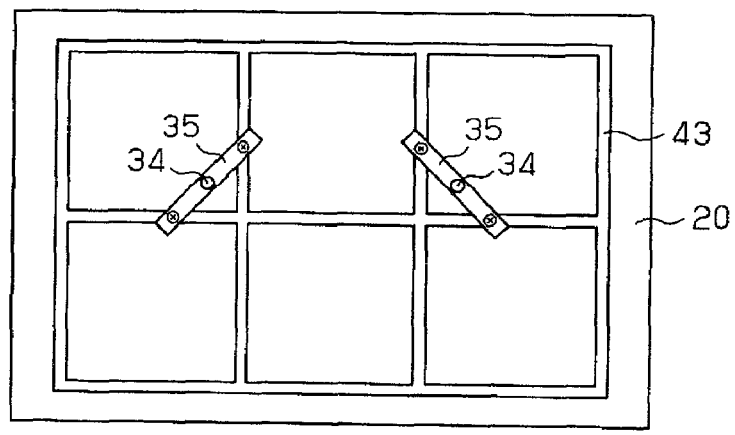
FIG. 6 is a plan view of another embodiment of the present invention.
Figure 7:
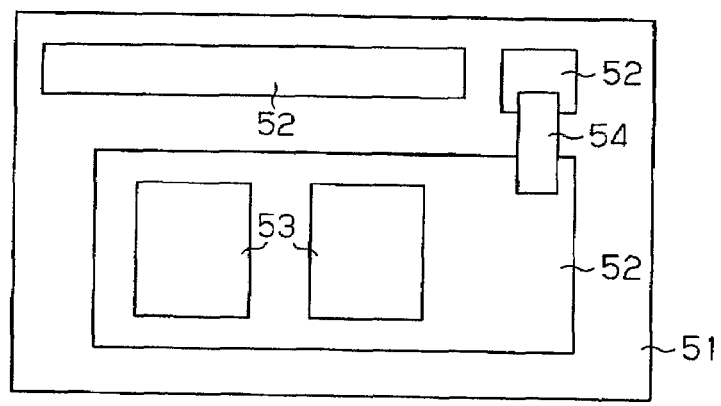
FIG. 7 is a plan view of a semiconductor unit as a background art.

Each of the support plates 35, 39 and 42 may be supported at both ends. For example, as shown in FIG. 6, when the support plate 35 is mounted to a rectangular frame 43 like a lattice, the support plate 35 is located across the cross bars of the frame 43 so as to be supported at both ends, and the temperature sensor 34 is mounted to the middle of the support plate 35. In such a case, the temperature sensor 34 can be supported more stably, as compared to a case wherein the support plate 35 is supported at one end.

The temperature sensor 34 needs not to be pressed to the circuit pattern 24B on which the semiconductor chip 23 is mounted. For example, the temperature sensor 34 may be pressed to the circuit pattern 24C on which the semiconductor chip 23 is not mounted, or may be pressed directly to the ceramic plate 26. However, the temperature sensor 34 arranged so as to be in contact with the circuit pattern 24B results in more accurate detection of the temperature of the semiconductor chip 23.

In the previous embodiments, the temperature sensor 34 includes the thermistor 34A received in the cylindrical case 37. Alternatively, a diode may be received in the cylindrical case 37. Since the current-voltage characteristic of a diode is highly dependent on a temperature, for example, when a diode is used for the temperature sensor 34, a temperature of the semiconductor chip 23 can be detected based on the variation of the current-voltage characteristic that is previously stored in a memory.

The cylindrical case 37 constituting the temperature sensor 34 may have a polygon shape or an ellipse shape in the cross section. In addition, a temperature sensor such as a thermistor or a diode may be received in a box-shaped case.

An electrically conductive material having a high thermal conductivity may be used for sealing a temperature sensor (thermistor 34A) received in the cylindrical case 37. In such a case, however, the temperature sensor is affected by an electric potential at the circuit patterns 24B and 24C when the cylindrical case 37 is in contact with the circuit patterns 24B and 24C. Therefore, a temperature of the semiconductor chip 23 needs to be calculated from the detection signal of the temperature sensor, with consideration of the effect of the electric potential.

The support plates 35, 39 and 42 need not to be a rectangular plate. For example, when supported at one end, the support plates 35, 39 and 42 may be in the form of a crank or may have an L shape when being. When supported at both ends, the support plates 35, 39 and 42 may have a generally U shape.

The inverter 11 may include plural temperature sensors 34. Specifically, each of the upper and lower arms may include one temperature sensor 34, or each of the pairs of the upper and lower arms may include one temperature sensor 34.

The number of the pairs of the switching device Q and the diode D in each arm may be less than or more than four, depending on the amount of current flowing through each arm. For example, each arm may be composed of one switching device Q and one diode D.

In the previous embodiments, a pair of one switching device and one diode is incorporated in the semiconductor chip 23 as a package. Alternatively, the switching device and the diode may be separately mounted on the different circuit patterns.

The inverter 11 may be composed of two pairs of the upper and lower arms for generating single-phase AC.

The present invention may be applied not only to an inverter but also to a DC-DC converter.

The number of the capacitors 17 may be less than or more than four, depending on the rated current of the inverter 11 and the capacitance of the capacitor 17. Alternatively, the inverter 11 may include no capacitor 17.

Power transistors such as an insulated-gate bipolar transistor (IGBT) or a thyristor may be used for the semiconductor chip 23.

What is claimed:

1. A semiconductor unit, comprising:
a semiconductor chip;
a ceramic substrate having a circuit pattern on which the semiconductor chip is mounted;
a temperature sensor in contact with the circuit pattern for detecting a temperature of the semiconductor chip;
a support plate that provides a mount for said temperature sensor and presses the temperature sensor against the ceramic substrate;
a metal base on which the ceramic substrate is mounted; and
a frame made of a non-conductive material and mounted on the metal base so as to surround the ceramic substrate,
wherein the support plate presses the temperature sensor against the circuit pattern on which the semiconductor chip is mounted,
wherein the support plate is a leaf spring,
wherein the support plate is fixed to the frame, and
wherein the support plate is mounted on the metal base so as to project over the ceramic substrate from the frame, and the temperature sensor is mounted on the projecting end of the support plate and pressed against the ceramic substrate.

2. The semiconductor unit according to claim 1, wherein the support plate is a coil spring.

3. The semiconductor unit according to claim 1, wherein the temperature sensor includes a cylindrical case made of a metal having a high thermal conductivity, and a thermistor received in the cylindrical case.

4. The semiconductor unit according to claim 1, wherein the temperature sensor includes a thermistor sealed by an electrically insulating material having a high thermal conductivity.

5. The semiconductor unit according to claim 1, wherein a pressing force that the support plate provides to the ceramic substrate is 50 N or less.

* * * * *